Aug. 13, 1957 C. F. JORDAN, JR 2,802,908

AUTOMATIC TUNING MEANS

Filed Dec. 18, 1953 2 Sheets-Sheet 1

INVENTOR.
CARL F. JORDAN JR.
BY Marvin Moody
ATTORNEY

INVENTOR.
CARL F. JORDAN JR.
BY Marvin Moody
ATTORNEY

United States Patent Office 2,802,908

Patented Aug. 13, 1957

2,802,908

AUTOMATIC TUNING MEANS

Carl F. Jordan, Jr., Cedar Rapids, Iowa, assignor to Collins Radio Company, Cedar Rapids, Iowa, a corporation of Iowa Application December 18, 1953, Serial No. 399,010

11 Claims. (Cl. 179—171)

This invention relates generally to automatic tuning means and particularly to a device which tunes a power amplifier to a signal frequency.

Oftentimes, it is necessary to provide automatic tuning for the power amplifier of a transmitter. Automatic tuning simplifies manual tuning by decreasing the number of knobs on the control panel so that a single knob may control the tuning of a large system.

It is the principal object of this invention to provide means for automatically tuning a power amplifier to a signal frequency.

It is another object of this invention to provide an automatic monitor for a power amplifier.

Sometimes aging or vibration causes the resonant frequency of a tuned circuit to drift slowly. It is a further object of this invention to provide means for returning a power amplifier without interruption.

The control grid of a class —C power amplifier is generally driven positive over a portion of a cycle, and grid current flows during that portion. Grid current varies with tuning and is a maximum when the amplifier is tuned. This invention accomplishes peak tuning by using the first derivative of grid current. Coarse tuning is accomplished by using the undifferentiated grid current.

Further objects, features and advantages of this invention will be apparent to a person skilled in the art upon further study of the specification and drawings in which.

This invention provides automatic tuning for a class —C power amplifier which has a grid connected input tank circuit. The invention can tune both the amplifier's input tank circuit and its output tank circuit if they track. If they cannot track, they must be tuned individually by separate devices made according to this invention. The embodiment in this specification assumes that they track.

Figure 1:
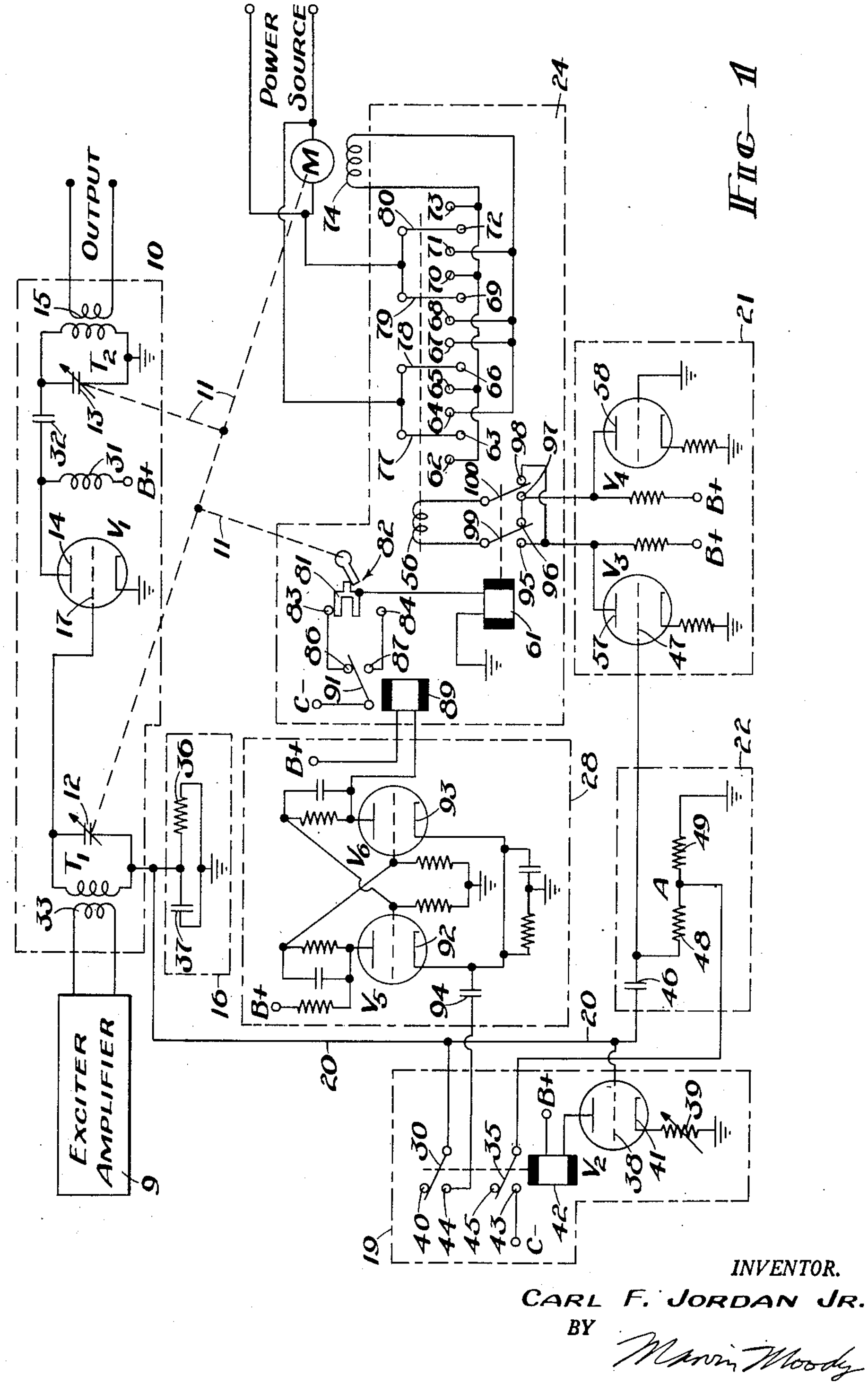
Figure 1 is a detailed schematic diagram with a block diagram superimposed thereon.

As shown in Figure 1, a coil 33 inductively connects an exciter amplifier 9 to the input tank circuit $T_1$ of a power amplifier 10.

A power amplifier tube $V_1$ has its control grid 17 connected to one side of tank $T_1$ and has its cathode grounded. An output tank circuit $T_2$ is connected between ground and the plate 14 of tube $V_1$ through a blocking condensor 32. A choke coil 31 is connected between a B plus power supply and plate 14. An output coil 15 inductively connects output tank $T_2$ to a load which might be an antenna.

Tanks $T_1$ and $T_2$ may be tuned by varying either or both of their reactive elements. The described embodiment varies the capacitors 12 and 13.

The output shaft 11 of a control motor M is mechanically coupled to capacitors 12 and 13. The remaining structure of this invention control motor M in such manner that capacitors 12 and 13 are adjusted to resonate tanks $T_1$ and $T_2$ with the input frequency from exciter amplifier 9.

A resistor 36 is connected in parallel with a capacitor 37, and they are connected between ground and the other side of tank $T_1$. Resistor 36 and capacitor 37 comprise a detector circuit 16. A lead 20 is connected to the ungrounded side of detector 16 and removes its output which is a negative voltage proportional to grid current.

A slewing tube $V_2$ has its control grid 38 connected to lead 20, and its cathode 41 is connected to a variable resistor 39 that is grounded. Resistor 39 is adjusted to bias tube $V_2$ below cutoff when tank $T_1$ is tuned.

A slewing relay 42 is connected between a B plus power supply and the plate of tube $V_2$. Relay 42 has a first moving contact 30 that alternately engages terminals 40 and 44 and has a second moving contact 35 that alternately engages terminals 43 and 45. Terminal 43 is connected to a negative unidirectional power source, C minus, and terminal 45 is open. Moving contact 35 is connected at point A to a grounded resistor 49. The connections for moving contact 30 and terminals 40 and 44 are described below. Tube $V_2$ and relay 42 with their interrelated connecetions comprise a slewing circuit 19 which provides a coarse tuning means in the invention. Its operation is described later in this specification.

One side of a capacitor 46 is also connected to lead 20. A resistor 48 is connected between the other side of capacitor 46 and resistor 49. Series connected capacitor 46 and resistors 48 and 49 comprise a differentiating circuit 22. Circuit 22 provides a voltage output across resistors 48 and 49 that is the differential of the voltage received by capacitor 46 from lead 20.

A tube $V_3$ has its control grid 47 connected to the differentiated output across resistors 48 and 49. The control grid of another tube $V_4$ is grounded. The plate resistors and the cathode resistors of tubes $V_3$ and $V_4$ are equal, respectively. Tubes $V_3$ and $V_4$ and their resistors form a bridge amplifying circuit 21. An output is taken across the plates 57 and 58 of tubes $V_3$ and $V_4$. This voltage is zero when grid 47 is at ground potential because this balances bridge circuit 21.

Plates 57 and 58 are connected to the terminals of a relay 61 as follows: Terminals 95 and 98 are connected to plate 57, and terminals 96 and 97 are connected to plate 58. The moving contacts 99 and 100 of relay 61 connect to the ends of a relay 56.

The terminals 62—73 and the moving contacts 77—80 of relay 56 connect, when engaged, the field coil 74 of motor M to the power source of motor M. One side of field 74 is connected to terminals 64, 67, 68 and 71; and the other side is connected to terminals 62, 65, 70 and 73. Moving contacts 77 and 78 are connected to one side of the power source for motor M, and moving contacts 79 and 80 are connected to the other side of the power source. Terminals 63, 66, 69 and 72 are unconnected; and moving contacts 77—80 are spring biased to these terminals when relay 56 is unenergized. When the moving contacts engage terminals 62, 65, 70 and 73, motor M rotates in one direction; and when the moving contacts engage terminals 64, 67, 68 and 71, motor M rotates in the opposite direction because its field current is reversed.

Relay 61 is grounded on one side and has its other side connected to the moving element 81 in a limit switch 82 which limits the mechanical movement of the tuning elements in tanks $T_1$ and $T_2$. Limit switch 82 is bistable and has its terminals 83 and 84 connected to the terminals 86 and 87 of a relay 89, which has a moving contact 91 that is connected to a negative supply voltage, C minus.

Relays 56, 61 and 89 and limit switch 82 provide a direction circuit 24 that controls the direction of rotation of motor M. A reversal of contacts in any of these relays or limit switch 82 will reverse the direction of motor M.

A pair of tubes $V_5$ and $V_6$ and related connections comprise a bistable or trigger circuit 28 which is often termed a flip-flop circuit. Trigger circuit 28 is connected in conventional manner and relay 89 is connected as the plate load for tube $V_6$. The cathodes 92 and 93 of tubes $V_5$ and $V_6$ are connected to terminal 44 of relay 42 through a condensor 94. The moving contact 30 of relay 42 is connected to lead 20. Bistable circuit 28 is actuated only by positive pulses which are received under special circumstances which will be described later.

Whenever tank $T_1$ is resonant with the input frequency, it provides a maximum of positive drive voltage to tube $V_1$; and a maximum of grid current flows to ground through detector 16 which then provides a maximum output voltage to lead 20. If for any reason tank $T_1$ is no longer resonant with its input frequency, the negative output voltage from detector 16 accordingly decreases, and becomes substantially zero when the signal frequency is far from resonance.

Figure 4:
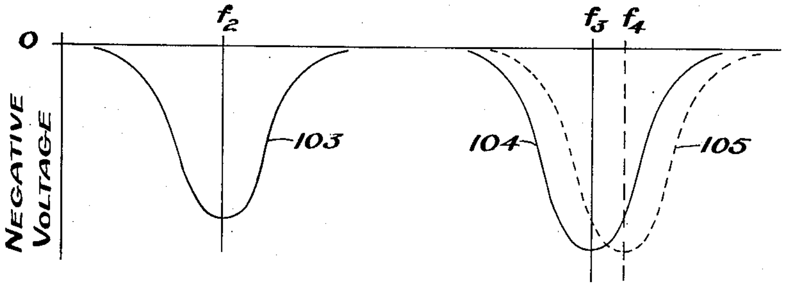
Figure 4 shows the grid current curve for two different signal frequencies. A grid current curve for a tank circuit frequency which has drifted is shown in dotted lines.

Let it be assumed that amplifier 10 has been tuned to a signal frequency $f_2$ (shown in Figure 4), and it is desired to tune it to another signal frequency $f_3$. Switching the signal frequency of exciter amplifier 9 from $f_2$ to $f_3$ will cause the invention to automatically tune amplifier 10 to frequency $f_3$. The sequence of events which occur are described below:

A signal with frequency $f_3$ is injected into tank $T_1$ and the grid current curve 104 for frequency $f_3$ in Figure 4 controls. Since tank circuit $T_1$ is very much out of tune with frequency $f_3$, insufficient signal is received by grid 17 to drive it positive and virtually no grid current flows. The output of detector 16 therefore becomes substantially zero and is carried by lead 20 to grid 38 of slewing tube $V_2$.

The decrease of detector voltage in a positive direction causes tube $V_2$ to conduct, and slewing relay 42 is energized. It is to be remembered that tube $V_2$ was adjusted below cutoff by biasing resistor 39 when tank $T_1$ was tuned. Terminal 43 is engaged by contact 35, and C minus voltage is applied to grid 47 of bridge circuit tube $V_3$ through resistor 48.

Bridge circuit 21 is thereby unbalanced and its output current flows through the contacts 99 and 100 of relay 61, as they may be randomly set, to energize relay 56. Motor M will then rotate in a random direction which will take the resonant frequency of tank $T_1$ either toward or away from frequency $f_3$. If a direction away from frequency $f_3$ occurs, limit switch 82 is actuated, motor rotation is reversed, and the frequency of tank $T_1$ must very soon approach frequency $f_3$.

As the resonant frequency of tank $T_1$ begins to intersect grid current curve 104 in Figure 4, the output voltage of detector 16 accordingly increases negatively.

When the detector voltage becomes sufficiently negative, slewing tube $V_2$ cuts off and relay 42 opens to remove the C minus voltage from grid 47 of bridge tube $V_3$. Slewing circuit 19 remains disabled by the large negative output from detector 16 in the vicinity of resonance.

Figures 2, 3:
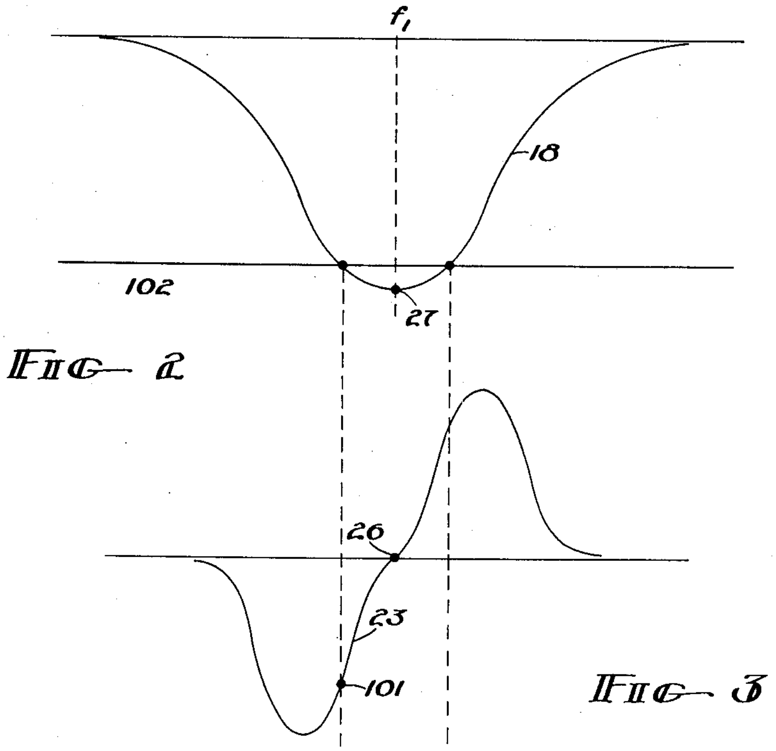
Figure 2 shows the grid current curve obtained by tuning through a signal frequency.
Figure 3 is a curve of differentiated grid current obtained by differentiating the grid current plotted in Figure 2.

The instant that slewing circuit 19 is disabled, the voltage on grid 47 of tube $V_3$ changes from the negative C minus voltage to a negative differential voltage which is shown as point 101 on the differentiated grid current curve 23 in Figure 3. A change from negative to negative voltage is necessary to continue the rotation of motor M in the same direction. The negative loop of differentiated curve 23 always occurs first because of tank $T_1$'s approach to the tuned position, and the voltage at point 101 occurs because that is the place where the C minus voltage is removed.

Tanks $T_1$ and $T_2$ have been coarsely tuned by the operation of slewing circuit 19 and the resonant frequency of tanks $T_1$ and $T_2$ are close to but are not at frequency $f_3$.

Grid 47 now receives only the differentiated voltage 23 across resistors 48 and 49. The differentiated voltage was previously made insignificant by the much larger C minus voltage on grid 47, but now the differentiated voltage solely controls the balance of bridge amplifier circuit 21 which provides an amplified output proportional to the differentiated voltage.

The differentiated voltage soon becomes substantially zero at point 26 in Figure 3 as motor M rotates to the tuned position, and bridge circuit 21 becomes balanced. Electromagnet 56 is deenergized, field circuit 74 is opened, and motor M is stopped with tank circuits $T_1$ and $T_2$ at resonance. Amplifier 10 is now in tune.

A brake may be applied to motor M if desired to stop it more quickly. The brake may be operated by a relay in series with field 74. The relay contacts will close when the field circuit is broken.

Bistable circuit 28 provides an automatic frequency control which maintains the tank circuits in tune. Vibration, unstable components, or large temperature variations may cause the resonant frequency of a tank circuit to drift. Grid current curve 105 in Figure 4 is an example of drift from $f_3$ to $f_4$. The output of the detector accordingly decreases with drift until it drops below a minimum actuating voltage, which is necessary to actuate slewing circuit 19.

The parameters of slewing tube $V_2$ determine what detector voltage will actuate slewing circuit 19. The actuating voltage level may be determined by the setting of biasing resistor 39 and may be set, for example, at ninety percent of the detector's maximum negative output voltage. Slewing circuit 19 will be actuated when the ninety percent voltage is exceeded. Line 102 in Figure 2 shows an actuating voltage level which is ninety percent of the maximum voltage shown at point 27.

Slewing tube $V_2$ begins conduction when the frequency drifts sufficiently to lower the detector voltage to the actuating voltage level, and bridge 21 is accordingly unbalanced by the C minus voltage from relay 42. Motor M therefore rotates in one direction or the other according to the random setting of the contacts of relay 61. If motor M actuates tank $T_1$ toward resonance, slewing relay 19 cuts out when the specified level for tube $V_2$ is exceeded; and differentiation circuit 21 takes over and tunes as explained above. If, however, motor M actuates tank $T_1$ away from resonance, the sudden change in grid currents, because of the steep sides of the grid current curve, generates a positive pulse with the aid of condensor 94 and triggers bistable circuit 28 to reverse the contacts in relay 89. The direction of motor M is accordingly reversed and the tank circuits are brought directly back to peak resonance with the aid of differentiating circuit 22 in the manner described above.

It is therefore seen that this invention provides an automatic tuning means which maintains a power amplifier in tune with its signal frequency. Means are further provided to maintain the amplifier tuned when unpredictable events, such as aging effects and the vibration of components, cause frequency drift.

Although this invention has been described with respect to preferred embodiments thereof, it is not to be so limited as changes and modifications may be made therein which are within the full intended scope of the invention as defined by the appended claims.

I claim:

1. An automatic tuning system for a power amplifier including an amplifier tube with a grid, wherein a tank circuit is connected in series with the grid and has an adjustable tuning element, the system comprising, a detector connected in series with the grid of said amplifier, grid current flowing through the detector providing the output of the detector, a slewing circuit with its input connected to the output of said detector and actuated when the detector output falls below a specified value, a differentiating circuit also connected to the output of said detector, a bridge amplifier with at least one tube having a control grid, the grid of the bridge amplifier tube connected to the differentiating circuit output and to the slewing circuit output, a motor having a field and an output shaft that is coupled to the adjustable tuning element of said tank circuit to vary the tuning of the tank circuit by motor rotation; a direction circuit including a motor control relay having a plurality of reversible contacts with a normally-off position when the relay is de-energized, a limit relay having a plurality of reversible contacts, a bi-stable relay including at least a single set of contacts, and a limit switch coupled mechanically to the adjustable tuning means and having contacts actuated at limit positions; a power source connected to the motor field through the reversible contacts of the motor control relay to provide reversible motor rotation, the reversible contacts of the limit relay connected between the output of the bridge circuit and the motor control relay, the limit relay connected between ground and the output of the limit switch, another power source connected to the limit switch through the contacts of the bi-stable relay, a bi-stable circuit, and the slewing circuit having contacts connected between the detector output and the input of the bi-stable circuit, whereby an input signal actuates the system to automatically tune the tank circuit to the frequency of the input signal.

2. A device as in claim 1 in which said detector circuit comprises, a resistor and a capacitor in parallel with one of their ends grounded and their other ends connected to the tank circuit.

3. A device as in claim 1 in which said slewing circuit comprises, a tube with a control grid connected to said detector circuit output, a variable resistor connected between the cathode of said slewing tube and ground, a slewing relay connected in series with the plate of said slewing circuit and having two single-throw contacts that are open when said relay is not energized, one of the relay contacts connecting a negative supply voltage to the bridge circuit when closed, and the other of said contacts connecting the output of said detector to the input of said bi-stable circuit when closed.

4. A device as in claim 1 in which said bridge amplifier circuit comprises, a pair of tubes having control grids, equal resistors respectively connected between the cathode and ground of each of said tubes, a pair of equal resistors respectively connected between the plates of said tubes and a B plus power supply, the grid of one of said tubes connected to ground, the grid of the other tube connected to the output of said differentiating circuit, and an output taken across the plates of said tubes.

5. A device as in claim 1 in which said direction circuit comprises, a motor control relay having a plurality of three position contacts, a limit relay arranged with two-pole two-position contacts, the electromagnet of said motor control relay connected through the contacts of said second relay to the output of said bridge amplifier circuit to reverse the current through the electromagnet of the motor control relay, a limit switch coupled to the adjustable tuning means in the tank circuit to sense limit positions, the electromagnet of the limit relay connected between ground and the limit switch, the motor control relay contacts connected between the motor field and the power source so that the field is disconnected when the motor control relay electromagnet is not energized and so that the field is connected with opposite polarity when the contacts of the limit relay reverse position.

6. A device as in claim 1 in which said bi-stable circuit comprises a trigger circuit with two electron tubes, the bi-stable relay composed of a polarized relay with double-throw single-pole contacts and with its electromagnet connected in series with the plate circuit of one of said tubes, the moving contact of the polarized relay connected to a power source, the limit switch having stationary contacts at its limit positions with the contacts connected respectively to the contacts of the bi-stable relay, a condenser connected on one side to the cathode of one of the tubes in the bi-stable circuit, and a relay in the slewing circuit including single-pole single-throw contacts connected in series between the other side of the capacitor and the output of the detector circuit.

7. An automatic tuning system for a power amplifier having a grid, and a tank circuit connected serially to the grid, the system comprising, an adjustable tuning element with limited mechanical movement connected in the tank circuit to tune it, a detector circuit including a resistor and a capacitor connected in parallel between the tank circuit and ground and having an output taken from the ungrounded side of the detector circuit, a motor having an output shaft coupled to the adjustable tuning element in the tank circuit, a slewing circuit with a slewing tube that has a control grid connected to the output of the detector, a slewing relay connected between the plate of the slewing tube and a B plus power supply, a differentiating circuit having a capacitor connected on one side to the detector output and having first and second series resistors connected between the other side of the capacitor and ground, a first contact of the slewing circuit relay connecting when engaged the common point between the first and second resistors to a negative voltage supply, a bridge amplifier circuit which includes first and second electron tubes with control grids, the cathodes of the bridge tubes connected to ground through equal resistors, the plates of the bridge tubes connected to a B plus power supply through equal resistors, the grid of one of the bridge tubes connected to ground, the grid of the other of the bridge tubes connected to the ungrounded side of said differentiating circuit resistors, an output of the bridge circuit taken across the plates of the bridge circuit tubes, a direction circuit which includes a first relay with a plurality of contacts having a three position arrangement, a second relay with a double-pole double-position contact arrangement, the electromagnet of said first relay connected to the output of said bridge amplifier circuit through the contacts of said second relay with the two positions of the contacts reversing the connections to the bridge circuit, a field of the motor connected to a power source through the three position contacts of the first relay so that the first and third positions provide a reversal in power polarity through the field and the second position disconnects the power, a limit switch having double-throw contacts and an armature that is mechanically coupled to said motor shaft to actuate the contacts at the limit positions of the adjustable tuning element in the tank circuit, the armature of the limit switch connected to one side of the second relay which has its other side grounded, a bi-stable circuit that has two electron tubes, a blocking condenser and a set of contacts actuated by the slewing relay connected in series between the output of the detector and the cathode of one of the bi-stable circuit tubes, a bi-stable relay with single-pole double-throw contacts, the electromagnet of the bi-stable relay connected in series with the plate of one of the tubes in said bi-stable circuit, the stationary contacts in said bi-stable relay respectively connected to the stationary contacts in said limit switch, and a power source connected to the moving contact of said bi-stable relay.

8. An automatic system for coarse tuning a power amplifier having a tube with a grid that may be driven posi-tive by an input signal, the automatic system comprising, a tank circuit connected serially to the grid of said amplifier and having adjustable tuning means, a detector circuit connected between said tank circuit and ground, a slewing circuit connected to the output of said detector circuit, a slewing relay having double-pole single-throw contacts and connected in said slewing circuit with the contacts closed only when the output of said detector rises above a specified value, a bridge amplifier circuit including a tube with a grid, the grid of the amplifier tube connected to a negative voltage source through one contact in the slewing relay, a direction circuit connected across the output of said bridge amplifier circuit, a motor having an output shaft coupled to the adjustable tuning means in the tank circuit of said amplifier, a field of said motor connected to the output of said direction circuit, and relay means included in the direction circuit to control motor actuation and direction in response to the unbalancing of the bridge amplifier circuit.

9. An automatic system for fine tuning a power amplifier having a tube with a grid that may be driven positive by an input signal, the system comprising, a tank circuit connected serially to the grid of the amplifier tube and having adjustable tuning means, a motor having an output shaft connected to the adjustable tuning means of the tank circuit to vary its tuning, a detector circuit serially connected between the tank circuit and ground, a differentiating circuit having its input connected to the output of the detector circuit, a bridge amplifier circuit having at least one tube with a control grid, the control grid of the bridge circuit tube connected to the output of the differentiating circuit, the bridge circuit normally balanced and only unbalanced by the output of the differentiating circuit, a direction circuit with its input connected to the output of said bridge circuit, and a field of said motor actuated by the output of the direction circuit to control the rotation of said motor.

10. Automatic tuning means for a class-C amplifier having a control grid that receives an input signal and comprising, a tank circuit having an adjustable tuning means for tuning the tank circuit to the frequency of the input signal, the tank circuit having one end connected to the control grid, a detector circuit including a resistor and a capacitor connected in parallel between ground and the other end of the tank circuit, a slewing circuit including a slewing tube and a slewing relay means having contacts that are actuated by the tube, the input to the slewing tube connected to the ungrounded side of the detector circuit, a voltage source connected by some of the slewing relay contacts to provide the output of the slewing circuit when the received output of the detector circuit exceeds a predetermined value, a bridge amplifier circuit having at least one tube with a control grid connected to the output of the slewing circuit, the bridge circuit being unbalanced by the unidirectional voltage output of the slewing circuit, a motor having a field coil and an output shaft that is connected to vary the adjustable tuning means of the tank circuit, a direction circuit including a motor control relay means having a plurality of contacts, the motor control relay means connected to the output of the bridge amplifier circuit and actuated when the bridge is unbalanced, a power source connected to the field of the motor through the reversible contacts of the motor control relay, and the motor rotating only when the motor control relay is actuated by the bridge amplifier circuit, whereby the input signal drives the control grid of the class-C amplifier positive when the tank circuit is in tune and causes grid current flow through the detector circuit to provide a negative detector voltage which deactivates the slewing circuit and causes the motor to stop rotation.

11. An automatic tuning system for a class-C amplifier having a control grid that receives an input signal and comprising, a tank circuit having an adjustable tuning means for tuning the tank circuit to the frequency of the input signal, one end of the tank circuit connected to the control grid, a detector circuit including a resistor and a capacitor connected in parallel between ground and the other end of the tank circuit, a slewing circuit including a slewing tube and a slewing relay having contacts controlled by the slewing tube, the input to the slewing tube connected to the ungrounded side of the detector circuit, a voltage source connected by the contacts of the slewing relay to the output of the slewing circuit when the input received from the detector circuit exceeds a predetermined negative voltage, a bridge amplifier circuit having a tube with a grid connected to the output of the slewing circuit, the bridge circuit being unbalanced by the output voltage of the slewing circuit, a differentiating circuit having an input connected to the ungrounded side of the detector circuit and an output connected to the grid of the tube in the bridge amplifier circuit, a motor having a field winding and an output shaft that is connected to vary the adjustable tuning means to the tank circuit, a direction circuit including a motor control relay having reversible contacts with an open-circuit intermediate position, the electromagnet of the motor control relay connected across the bridge amplifier circuit and actuated when the bridge is unbalanced, a power source connected to the field of the motor through the reversible contacts of the motor control relay means so that the motor rotates in one direction when the motor control relay is actuated one way and rotates in the opposite direction when the motor control relay is actuated in a reversed manner, a second reversible relay included in the direction circuit and having a plurality of reversible contacts connected between the bridge circuit and the motor control relay for reversing the bridge circuit output with respect to the motor control relay, a limit switch coupled mechanically to the adjustable tuning means in the tank circuit to sense limiting positions of the adjustable means, the limit switch having an armature and opposite contacts, a power source connected to at least one of the contacts of the limit switch, and the second relay connected between ground and the armature of the limit switch, whereby the system varies the tuning of the tank circuit until it is tuned to the frequency of the input signal.

References Cited in the file of this patent

UNITED STATES PATENTS

| | | |
|---|---|---|
| 2,106,776 | Trevor et al. | Feb. 1, 1938 |
| 2,445,663 | Doelz | July 20, 1948 |
| 2,584,850 | De Mers | Feb. 5, 1952 |